United States Patent
Sheng

(10) Patent No.: US 11,152,236 B2
(45) Date of Patent: Oct. 19, 2021

(54) SYSTEM FOR AND METHOD OF MANUFACTURE USING MULTIMODAL ANALYSIS

(71) Applicant: SEMICONDUCTOR COMPONENTS INDUSTRIES, LLC, Phoenix, AZ (US)

(72) Inventor: Lieyi Sheng, Pocatello, ID (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 268 days.

(21) Appl. No.: 16/391,977

(22) Filed: Apr. 23, 2019

(65) Prior Publication Data
US 2019/0333795 A1 Oct. 31, 2019

Related U.S. Application Data

(60) Provisional application No. 62/664,797, filed on Apr. 30, 2018.

(51) Int. Cl.
| | |
|---|---|
| *H01L 21/00* | (2006.01) |
| *H01L 21/67* | (2006.01) |
| *G05B 19/418* | (2006.01) |
| *G05B 19/408* | (2006.01) |

(52) U.S. Cl.
CPC ...... *H01L 21/67276* (2013.01); *G05B 19/408* (2013.01); *G05B 19/4187* (2013.01); *H01L 21/67155* (2013.01); *H01L 21/67253* (2013.01)

(58) Field of Classification Search
None
See application file for complete search history.

(56) References Cited

U.S. PATENT DOCUMENTS

| | | | | |
|---|---|---|---|---|
| 6,073,501 A | * | 6/2000 | Rohner | G01N 21/94 73/865.8 |
| 6,694,208 B1 | * | 2/2004 | Sheu | G01R 31/01 700/121 |
| 2003/0022398 A1 | * | 1/2003 | Weng | G05B 19/4187 438/14 |
| 2018/0238958 A1 | * | 8/2018 | Song | G01R 31/2851 |

* cited by examiner

*Primary Examiner* — Paul B Yanchus, III
(74) *Attorney, Agent, or Firm* — Chamberlain Hrdlicka

(57) ABSTRACT

The disclosed embodiments include systems and methods of manufacturing a product. The system may include a non-transitory computer readable medium comprising computer readable program code for performing the method. The method may include manufacturing batches of the product according to steps of a process flow, determining output data for each batch, sequencing the batches by output data, determining a plurality of modes of output data based on grouping the batches, identifying a detrimental factor to output data in a process flow step based on a correlation between the process flow step and a mode of the plurality of modes, and correcting the detrimental factor.

20 Claims, 3 Drawing Sheets

SYSTEM FOR AND METHOD OF MANUFACTURE USING MULTIMODAL ANALYSIS

BACKGROUND

This section is intended to provide relevant background information to facilitate a better understanding of the various aspects of the described embodiments. Accordingly, it should be understood that these statements are to be read in this light and not as admissions of prior art.

The outputs of manufacturing processes may include product yields, yield losses, and characteristic parameters. For example, the yield for a product is highly determinative of the profitability of that product, and eliminating issues that cause a loss in yield is a high priority. Due to the dramatically increased complexity in product functionality and corresponding product development, achieving and maintaining high yields has been a constant challenge. A manufacturing lifespan may last for several decades, and detrimental factors, such as contaminants and erroneous tools, can readily degrade yields or even crash production lines. Characteristic parameters may include test and monitor results during and after manufacturing, which can help characterize the process variations and their impacts on product yield and reliability.

Identifying the detrimental factors causing yield loss can be difficult, especially in early stages of production before a large number of products have been produced. In analyzing yield, the same malfunctions can be grouped into a specific bin of yield loss, where the batches are in chronological order of manufacture. Current methods of identifying sources of yield loss include linking a yield loss in chronological order of manufacture with a specific step or tool. This may only enable weak correlations between the yield loss and the specific step or tool at different process steps. For example, in the manufacture of integrated circuits, the malfunction may be narrowed down to a wash step, or in the manufacture of vehicles, the malfunction may be narrowed down to a problem with the exhaust or the electrical system. Moreover, each step typically employs multiple tool-subsets. As a result, the root-cause of an issue can only be clarified by analyzing big data from many production batches and/or after several designs of experiments, which can be time-consuming and costly. In addition, the potential interactions among different steps may further weaken or cause inconsistencies to correlations.

BRIEF DESCRIPTION OF THE DRAWINGS

Embodiments of the Method of Manufacture Using Multimodal Analysis are described with reference to the following figures. The same numbers are used throughout the figures to reference like features and components. The features depicted in the figures are not necessarily shown to scale. Certain features of the embodiments may be shown exaggerated in scale or in somewhat schematic form, and some details of elements may not be shown in the interest of clarity and conciseness.

DETAILED DESCRIPTION

The embodiments disclosed herein include improvements in determining a detrimental factor of a manufacturing process. The detrimental factor is a specific step, machine, operator, operation, tool, or other implement or parameters thereof that may be altered, eliminated, or fixed to improve the outputs in the manufacturing process. The detrimental factor may be determined without large numbers of batches by sequencing by output data instead of by chronological order of batches and identifying a modality to the output data that may be correlated to a specific detrimental factor or factors. Sequencing by output data enables ruling out steps that may otherwise have required testing to confirm. The baseline process and its sub-processes addressed in the disclosed embodiments may be used in some of the most complex technologies of manufacturing. For example, a CMOS process integrated with a variety of high-voltage devices and memory cells may require several hundred process steps, with each step potentially including multiple tool subsets. Meanwhile, this CMOS process may run in a high volume with many millions of integrated circuit parts delivered every month to a variety of customers and used in different fields (e.g., in automotive, medical, consumer devices, etc.), for which high yielding and reliability are most desired.

Figure 1:
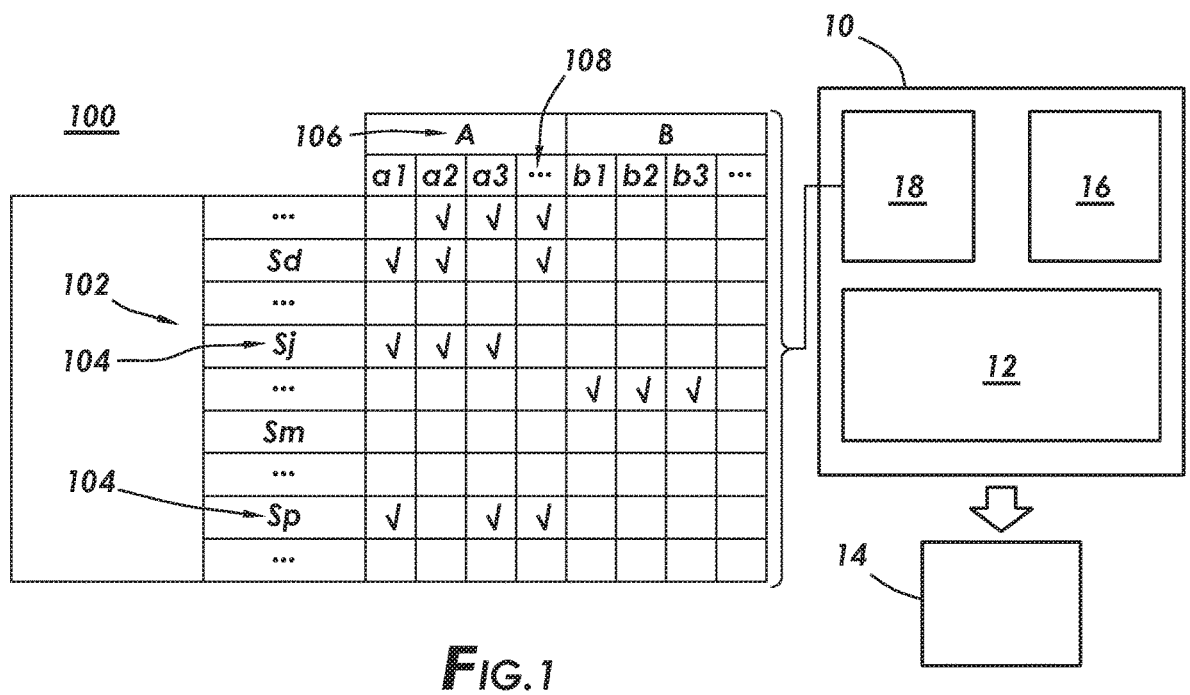
FIG. 1 is a schematic representation of a manufacturing system for performing a manufacturing process according to one or more embodiments.

FIG. 1 is a schematic representation of a manufacturing system 10 for performing a manufacturing process according to one or more embodiments. The system 10 includes manufacturing operations 12 such as tools, tool subsets, operators, machines, or other implements to manufacture a product 14. The product 14 may include any type of product manufactured through a number of process steps. For example, the product 14 may include a semiconductor wafer, an electrical component, an integrated circuitry, an automotive control circuit, a chemical product, or others. The system 10 may include a processor 16 or processors for automatically completing and evaluating process steps, or performing a method of manufacturing the product 14. A memory 18 may include non-transitory computer readable medium comprising computer readable program code for performing a manufacturing process 100. The manufacturing process 100 may include a number of steps 102. The steps 102 may be performed by the manufacturing operations 12 to manufacture the product 14. Increasingly, many manufacturing processes may include several hundred steps 102 in order to produce the product 14. The steps 102 may include potentially interactive steps 104 that may use the same or similar manufacturing operations 12, such as tools 106. For example, Tool A may be used, among other times, at steps Sj and Sp, which may be interactive steps 104. Each tool 106 may include multiple tool subsets 108, such as tool subsets a1, a2, a3, . . . that perform the same or similar step, but with a different machine, or a different operator performing the steps 102. For example, at step Sj the manufacturing process 100 utilizes tool subsets a1, a2, and a3, while step Sp does not utilize tool subset a2.

When the product 14 is manufactured, during and after the steps 102 have been completed, the product 14 may be tested for performance according to the functionality and reliability of several parameters. In many manufacturing processes, the product 14 may be processed in batches. Furthermore, the product 14 may be organized in batches based on the type of defect. For example, in a process 100 where the product 14 is an integrated circuit, one batch may include circuits that have defects causing electrical failure while another batch may include circuits that have structural failure. The functionality or reliability of the product 14 may be numerically recorded as an "output data" for the given batch. The output data may be given as a percentage of the batch (e.g., yield value), or may be given as a percentage lost from the batch (e.g., yield loss).

Figure 2:
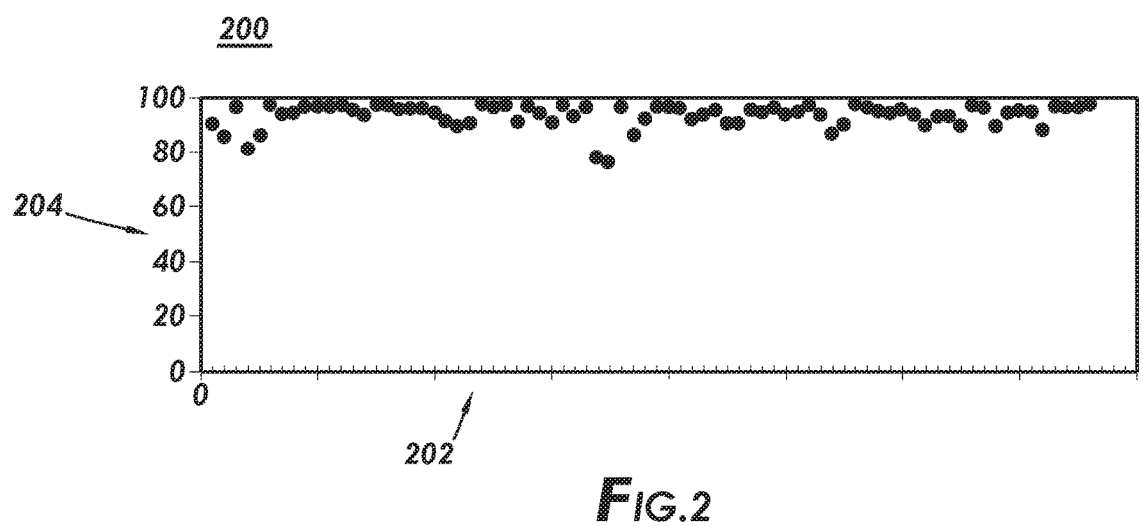
FIG. 2 is a chart of output value of batches organized in chronological order according to one or more embodiments.

FIG. 2 is a chart 200 of the output data of batches organized in chronological order. Each batch 202 is evaluated for output data given as yield value 204 according to the specific criteria and testing for that product 14. In certain embodiments of a product 14, the product 14 may be 80 percent functional, and thus given a yield value 204 of 80 percent. As illustrated, the batches often have a product yield value 204 that is less than 100 percent. To determine the detrimental factor causing the drop in yield value 204, the yield loss of each batch 202 may be categorized into separate bins based on a type of the yield loss.

The specific detrimental factor (e.g., among the steps 102 of the manufacturing process 100) may remain unknown after a number of batches has been run through the process. That is, it is only after a large number of batches from which a correlation to a specific step among the steps 102 may become evident. As a result, the detrimental factor can only be correlated by analyzing big data from many batches, and may even require conducting experiments that focus on confirming a specific step among the steps 102, which can be time-consuming and costly. In addition, the process interactions among different steps may further weaken or cause inconsistencies to correlations.

Figure 3:
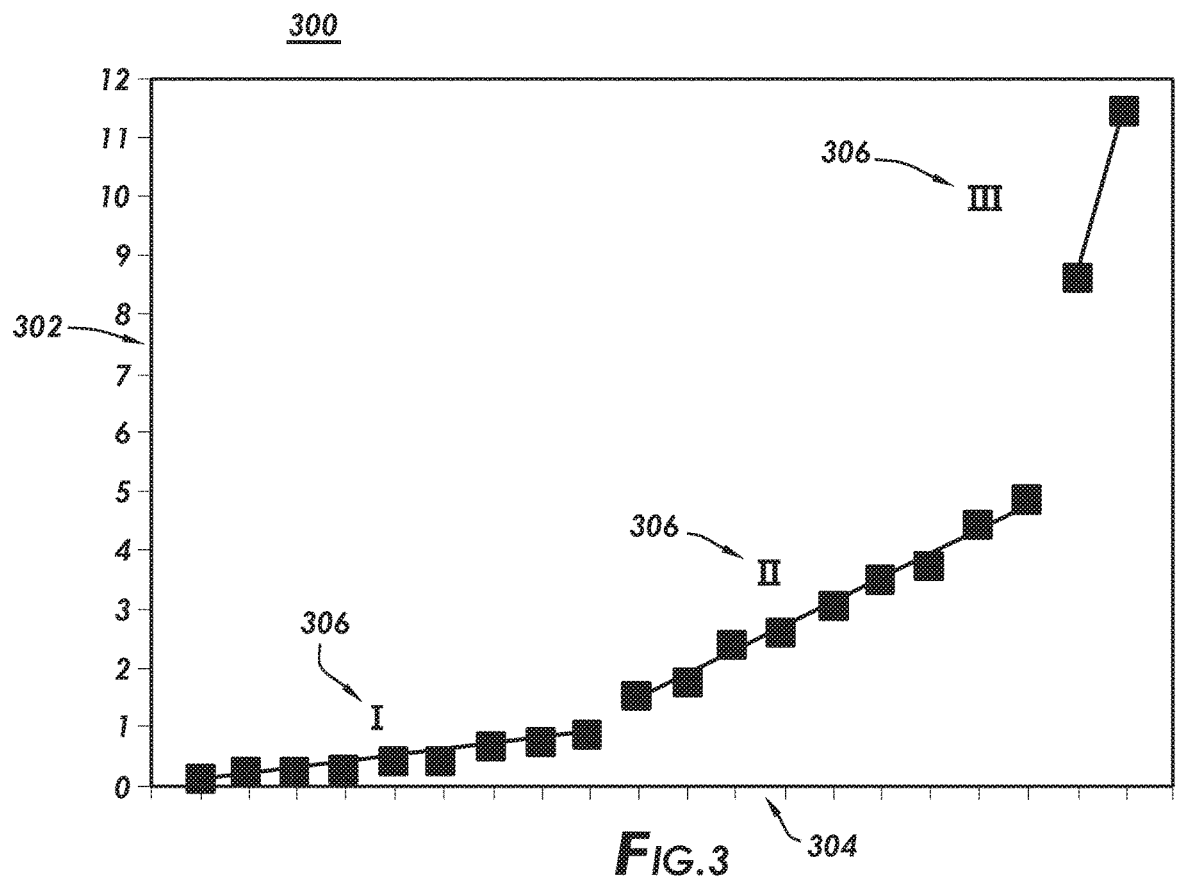
FIG. 3 is a chart of output value of batches sequenced according to the output data.

FIG. 3 is a chart 300 of batches 304 sequenced by output data 302 such as, for example, from low yield loss to high yield loss for a specific bin, according to one or more embodiments. It should be appreciated that the batches can also be sequenced from high yield loss to low yield loss. The sequenced batches may only contain a few dozen batches, but sequencing by yield loss 302 can indicate that the batches 304 represent multiple modes of yield loss. For example, as shown, three modes 306 of yield loss 302 (i.e., mode I, mode II, and mode III). The modes are determined by grouping the batches according to the percentage of yield loss. The number of modes 306 may indicate the number of detrimental factors and their interactions that are responsible for the yield loss 302. The processor 16 of the system 10 may include instructions for grouping the batches into the modes 306.

Figure 4:
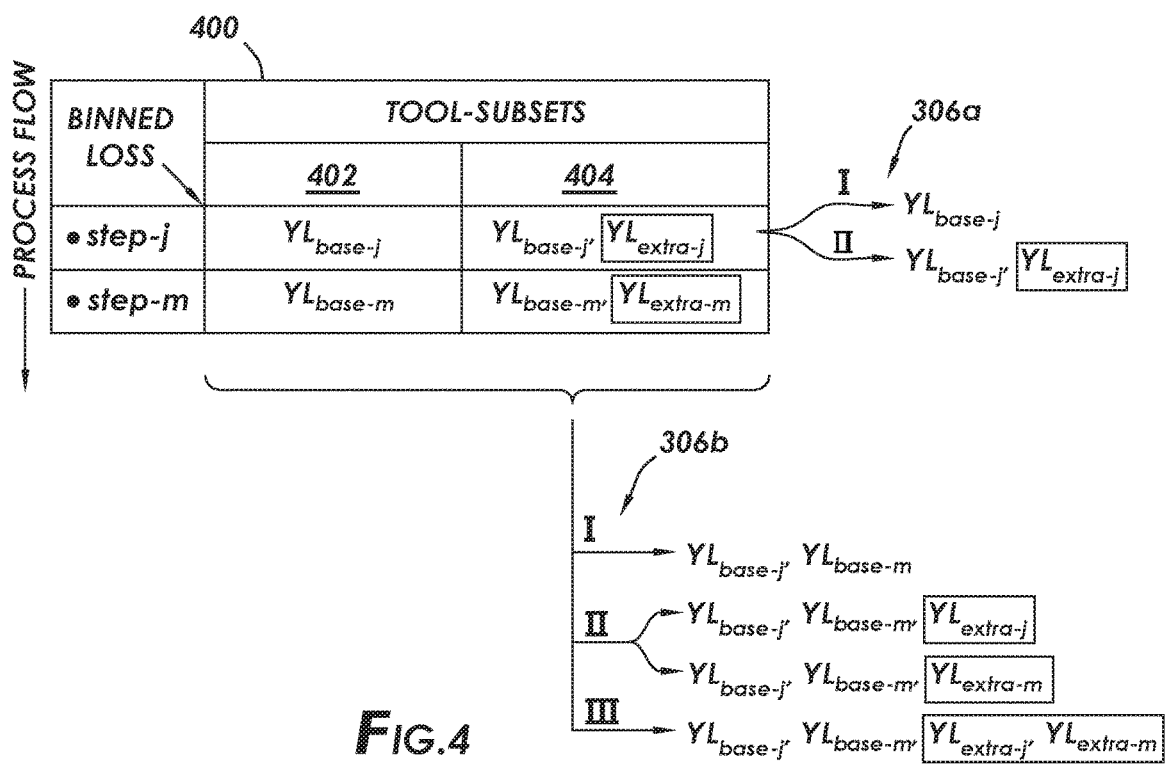
FIG. 4 is a chart of tool subsets in consideration for being the detrimental factor.

FIG. 4 illustrates a way of looking at the steps 102 to determine the detrimental factor. For example, as illustrated in table 400, a single detrimental factor, if used at just one step in the manufacturing process, is expected to result in two modes 306 of yield loss 302 (e.g., mode I of the top modes 306a, that utilizes the good subsets 402 without the detrimental factor, and mode II that utilizes the detrimental factor when the tool subset 404 goes wrong). Furthermore, if a detrimental factor is used and causes yield loss 302 at multiple steps (e.g., as potentially interactive steps 104), the yield loss 302 may contain multiple modes 306. That is, a first mode 306b (e.g., mode I of the bottom modes 306b) does not utilize the detrimental factor at any step, while a second mode 306b (e.g., mode II) may utilize the detrimental factor at only one of the multiple steps. Additionally, another mode 306b (e.g., mode III) may be evident in batches that utilize the detrimental factor more than one time (e.g, at more than one step 102). Mode III may represent, therefore, a potentially interactive pair 104 of steps 102 from the manufacturing process. Graphically revealing the existence of multiple modes 306 by re-sequencing according to yield loss 302 can thus provide a technological improvement by significantly reducing the amount of time needed to identify the number and relationship between detrimental factors in manufacturing the product 14.

Figure 5:
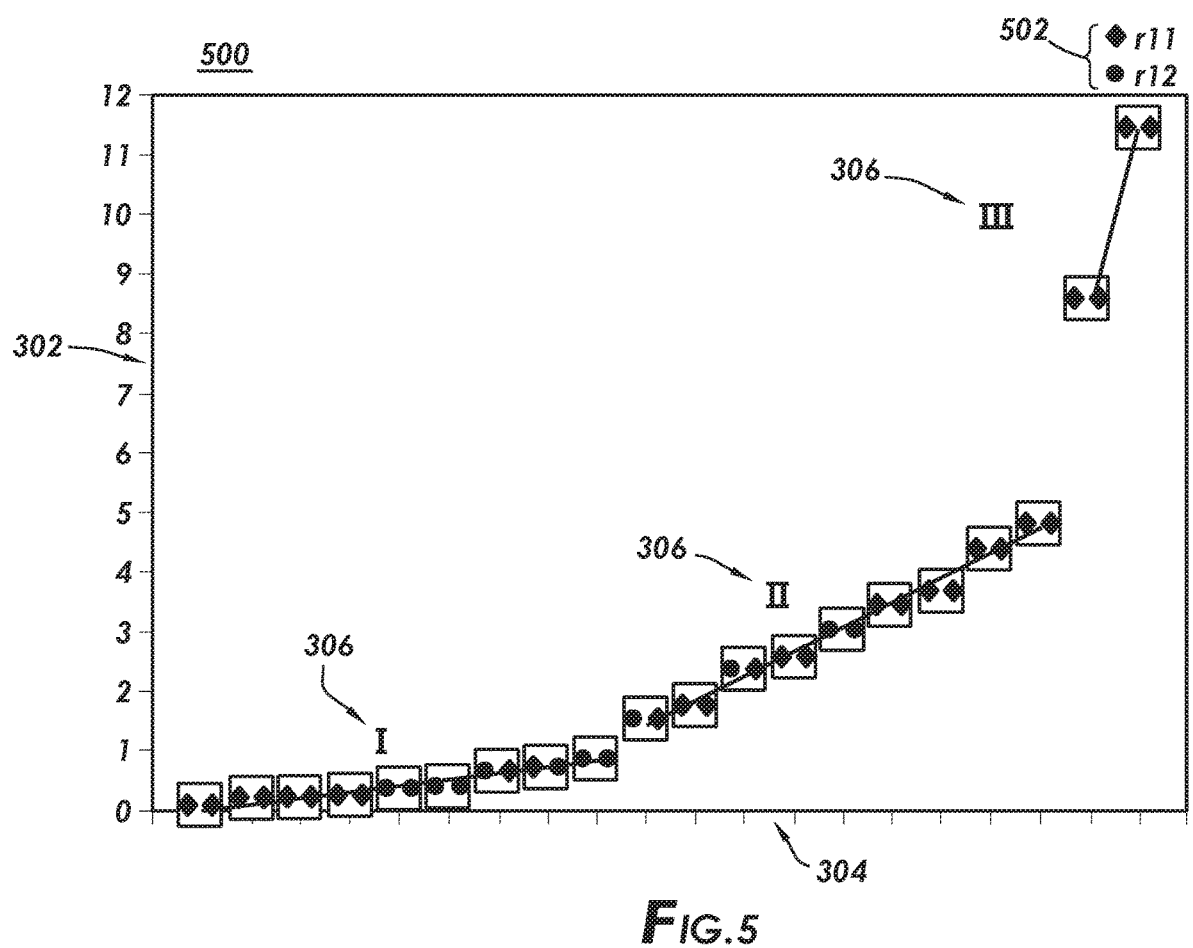
FIG. 5 is a chart of an example of tool subsets correlated to the different modes of output data.

A further benefit of re-sequencing the batches according to yield loss 302 is manifested when specific tool subsets are mapped on each of the batches. The mapping may be done manually or automatically by a processor programmed to analyze many combinations of detrimental factors. For example, FIG. 5 is a chart of the batches illustrated in FIG. 3, with an example of potential detrimental factor 502 (e.g., tool subsets 108) correlated to the different modes 306. In the illustrated embodiment, two tool subsets 502 (i.e., r11 and r12) are mapped for two steps 102 in the manufacturing process 100. Starting from the high side of mode II and into full mode III, all the batches are processed using the tool subset r11, which indicates that this specific tool subset may be the detrimental factor utilized twice at steps 102. Further specific testing of this tool subset may confirm this hypothesis and the r11 tool subset may be eliminated, revised, altered, or otherwise corrected. The tool subsets r11 and r12 may be selected for analysis based on a number of factors. A processor may also be programmed to evaluate each combination of tools subsets that is involved in a particular type of operation, and display the results of the detrimental factor.

One or more specific embodiments of the method of manufacture using multimodal analysis has been described. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time-consuming, but would nevertheless be a routine undertaking of design, fabrication, and manufacture for those of ordinary skill having the benefit of this disclosure.

Certain terms are used throughout the description and claims to refer to particular features or components. As one skilled in the art will appreciate, different persons may refer to the same feature or component by different names. This document does not intend to distinguish between components or features that differ in name but not function.

Reference throughout this specification to "one embodiment," "an embodiment," "an embodiment," "embodiments," "some embodiments," "certain embodiments," or similar language means that a particular feature, structure, or characteristic described in connection with the embodiment may be included in at least one embodiment of the present disclosure. Thus, these phrases or similar language throughout this specification may, but do not necessarily, all refer to the same embodiment.

The embodiments disclosed should not be interpreted, or otherwise used, as limiting the scope of the disclosure, including the claims. It is to be fully recognized that the different teachings of the embodiments discussed may be employed separately or in any suitable combination to produce desired results. In addition, one skilled in the art will understand that the description has broad application, and the discussion of any embodiment is meant only to be exemplary of that embodiment, and not intended to suggest that the scope of the disclosure, including the claims, is limited to that embodiment.

What is claimed is:

1. A non-transitory computer readable medium comprising computer readable program code for:
   determining a yield loss for each of a plurality of batches of a product manufactured according to steps of a process flow;
   categorizing at least some of the plurality of batches into at least one bin based on a type of the yield loss;
   sequencing the batches in the at least one bin by yield loss;
   determining a plurality of modes of yield loss of the batches in the bin based on grouping the batches in the bin; and
   identifying a detrimental factor in a process flow step causing the yield loss of the batches in the bin based on a mode of the batches in the bin.

2. The computer readable medium of claim 1 further comprising computer readable program code for correcting the detrimental factor.

3. The computer readable medium of claim 2, wherein correcting the detrimental factor comprises eliminating, revising, altering, correcting a tool subset in the process flow, or any combination thereof.

4. The computer readable medium of claim 1 further comprising computer readable program code for organizing the product into the batches.

5. The computer readable medium of claim 1, wherein the product comprises a semiconductor wafer or a semiconductor wafer comprising a plurality of integrated circuits.

6. The computer readable medium of claim 1, wherein the product comprises an electrical component, an automotive control circuit, a chemical product, or any combination thereof.

7. The computer readable medium of claim 1, wherein sequencing the batches by output data comprises sequencing the batches from low yield loss to high yield loss.

8. The computer readable medium of claim 1, wherein determining a plurality of modes comprises grouping the batches according to the percentage of yield loss.

9. The computer readable medium of claim 1, wherein identifying the detrimental factor comprises identifying tool subsets used at a specific step in the process flow.

10. A method of manufacturing a product, comprising:
    manufacturing batches of the product according to steps of a process flow;
    determining output data for each batch;
    sequencing the batches by output data;
    determining a plurality of modes of output data based on grouping the batches;
    identifying a detrimental factor to output data in a process flow step based on a correlation between the process flow step and a mode of the plurality of modes; and
    correcting the detrimental factor.

11. The method of claim 10, wherein correcting the detrimental factor comprises eliminating, revising, altering, correcting, or any combination thereof a tool subset in the process flow.

12. The method of claim 10, comprising organizing the product into the batches.

13. The method of claim 10, wherein sequencing the batches by output data comprises sequencing the batches from low yield loss to high yield loss.

14. The method of claim 10, wherein identifying the detrimental factor comprises identifying tool subsets used at a specific step in the process flow.

15. A system for manufacturing a product, comprising:
    manufacturing operations for manufacturing a product in batches according to a process flow; and
    a processor comprising instructions for:
        determining output data for each batch;
        sequencing the batches by output data;
        determining a plurality of modes of output data based on grouping the batches; and
        identifying a detrimental factor to output data in one of the manufacturing operations based on a correlation between the process flow step and a mode of the plurality of modes.

16. The system of claim 10, wherein the identified detrimental factor is correctable.

17. The system of claim 10, wherein the product comprises a semiconductor wafer, a semiconductor wafer comprising a plurality of integrated circuits, an electrical component, an automotive vehicle, a chemical product, a device, or any combination thereof.

18. The system of claim 15, wherein the instructions for identifying the detrimental factor comprise instructions for identifying tool subsets used at a specific step in the process flow.

19. The system of claim 15, wherein the instructions for determining a plurality of modes comprise instructions for grouping the batches according to the percentage of yield loss.

20. The system of claim 15, wherein the instructions for sequencing the batches by output data comprise instructions for sequencing the batches from low yield loss to high yield loss.

* * * * *